United States Patent [19]

Gaidano et al.

[11] Patent Number: 4,808,947

[45] Date of Patent: Feb. 28, 1989

[54] INTEGRATED ACTIVE FILTER WITHOUT EXTERNAL COMPONENTS

[75] Inventors: Roberto Gaidano; Marco Gandini; Mario Sartori, all of Torino, Italy

[73] Assignee: CSELT - Centro Studi E Laboratori Telecomunicazioni SPA, Torino, Italy

[21] Appl. No.: 35,984

[22] Filed: Apr. 8, 1987

[30] Foreign Application Priority Data

Apr. 10, 1986 [IT] Italy ................... 53252 A/86

[51] Int. Cl.⁴ ............................................. H03F 3/04
[52] U.S. Cl. .................................. 330/307; 357/45
[58] Field of Search ...................... 330/307; 357/45; 307/465, 466, 467

[56] References Cited

U.S. PATENT DOCUMENTS

4,641,108 2/1987 Gill, Jr. ...................... 330/307

Primary Examiner—James B. Mullins
Attorney, Agent, or Firm—Herbert Dubno

[57] ABSTRACT

An integrated circuit selectively programmable to form an active filter without external circuit components, the integrated circuit having $2^m$ amplifying modules where m is an integer between 2 and 4, inclusive, p resistive matrices where p is 1 when m is other than 4 and is 2 when m=4, and a bias circuit, r of the amplifying modules being positioned in a first column separated from a second column of r amplifying modules by a respective one of the resistive matrices, where r=4 when m is other than 2 and r=2 when m=2, the second column of amplifying modules being separated from a third column of 4 amplifying modules when m=4 by a second of the resistive matrices.

9 Claims, 9 Drawing Sheets

INTEGRATED ACTIVE FILTER WITHOUT EXTERNAL COMPONENTS

FIELD OF THE INVENTION

Our present invention relates to an electronic circuit using bipolar integrated circuit networks and, more particularly, to an integrated circuit forming selective active filters without external components.

BACKGROUND OF THE INVENTION

Various techniques are known for implementing active filters utilizing integrated circuits in bipolar or MOS technology. Such filters no longer require the use of expensive and cumbersome inductors, but do require the use of external capacitors, since high value capacitors and active elements are difficult to integrate on the same chip.

This problem has been partly solved by MOS technology switched-capacitor filters, in which the capacitors can be integrated.

Serious compatibility problems however arise when an MOS circuit must be inserted into a bipolar circuit, because of the different input impedances and breakdown voltages.

Unfortunately, switched-capacitor filters cannot be readily implemented in bipolar technology, since the available specific capacity is about half that obtainable in MOS technology, requiring large areas for the capacitive elements. The switches also can only be implemented with difficulty.

Active filters in bipolar technology can be implemented according to the method described in commonly owned Italian Patent Application No. 67809-A/85, (U.S. application Ser. No. 901,301 filed Aug. 27 1986, now U.S. Pat. No. 4,721,920 issued Jan. 26, 1988). It allows fully-integrated active filters to be made without external components, apart from two resistors for programming both the gain bandwidth product and dynamic range of the individual integrators.

The design is based upon conventional RLC (Resistor, Inductor, Capacitor) filters and arrives at an equivalent structure exclusively composed of operational amplifiers used as integrators, and of resistive dividers.

Such filters, known as "active R filters", have been first described by Michael A. Soderstrand in an article entitled: "Active R. Ladders: High-Frequency High-Order Low-Sensitivity Active R Filters Without External Capacitors" *IEEE Transactions on Circuits and Systems*, No. 12, December 1978.

An integrated circuit for the implementation of one or more filters of this kind comprises a number of resistors adapted to form resistive dividers, amplifying modules programmable as integrators or as input/output buffers, a bias circuit and access points for filter programming, inputs and outputs.

Moreover the transfer function of the desired filter should be able to be selected by programming a single metal mask according to the technology utilized in "structure array" integrated circuits.

OBJECTS OF THE INVENTION

The object of the invention is to provide an improved integration circuit for implementing active filters without external components, and whose transfer function can be programmed according to the customer's or user's design by operating only on the mask of the highest metal level, which does not require external capacitors, and which comprises the resistive elements necessary to implement the dividers.

SUMMARY OF THE INVENTION

This object is attained in accordance with the invention in an integrated circuit for implementing active filters without external components, which comprises in that it comprises 16, 8 or 4 amplifying modules (i.e. $2^m$ modules where m=2, 3, 4), two resistive matrices and a bias circuit, which, with some of the amplifying modules, is placed along a first column separated by a resistive matrix from adjacent columns of amplifiers, in turn possibly separated by another resistive matrix from the last column of amplifying modules.

According to one embodiment of the invention an integrated circuit comprises sixteen amplifying modules, two resistive matrices and a bias circuit. Four of the amplifying modules and the bias circuit are placed along a first column separated by a resistive matrix from two adjacent columns of four of the amplifying modules each, in turn separated by the other resistive matrix from the last column of four amplifying modules.

In another embodiment, the integrated circuit comprises eight amplifying modules, a resistive matrix and a bias circuit. The bias circuit with four amplifying modules are disposed along a first column separated by a resistive matrix from an adjacent column of four of the amplifying modules.

The third embodiment of the integrated circuit comprises four amplifying modules, a resistive matrix and a bias circuit. The bias circuit and two amplifying modules are disposed along a first column separated by a resistive matrix from an adjacent column of two amplifying modules.

In any of these three embodiments the resistive matrices consist of eight columns by eighty-eight rows of modular resistive elements horizontally arranged and separated every four rows by a row of eight metal trunks, and are traversed in the horizontal median zone by 64 metal trunks, horizontally arranged according to a matrix of eight rows by eight columns, the resistive elements and the trunks being equipped with accesses to a second metal level of the integrated circuit.

In any of the embodiments described, each of the amplifying modules can be equipped with accesses to the second metal level for the connection with bias lines, with accesses for programming circuit configuration, and with accesses for the output and for inverting and non-inverting inputs.

The circuit can be provided with pads to which power-supply and ground lines are connected, each one of the lines consisting of a wide line horizontally following the upper or lower profile of the amplifying modules and matrices, and of vertical lines, which in case of the power supply pass between said columns and are connected to amplifying modules and bias circuit and, in case of the ground, pass between resistive matrices and access the bias circuit.

Lines conducting bias currents start from the bias circuit, partly horizontally follow the upper boundary of the amplifying modules and of the resistive matrices and hence pass on the columns. Accesses to the second metal level are provided for the connection with the amplifying modules. Finally, pads can be provided for programming bias currents through external resistors and further pads can be provided for the active-filter inputs and outputs.

BRIEF DESCRIPTION OF THE DRAWING

The above and other objects, features and advantages of our invention will become more readily apparent from the following description, reference being made to the accompanying highly diagrammatic drawing in which.

SPECIFIC DESCRIPTION

Figure 1:
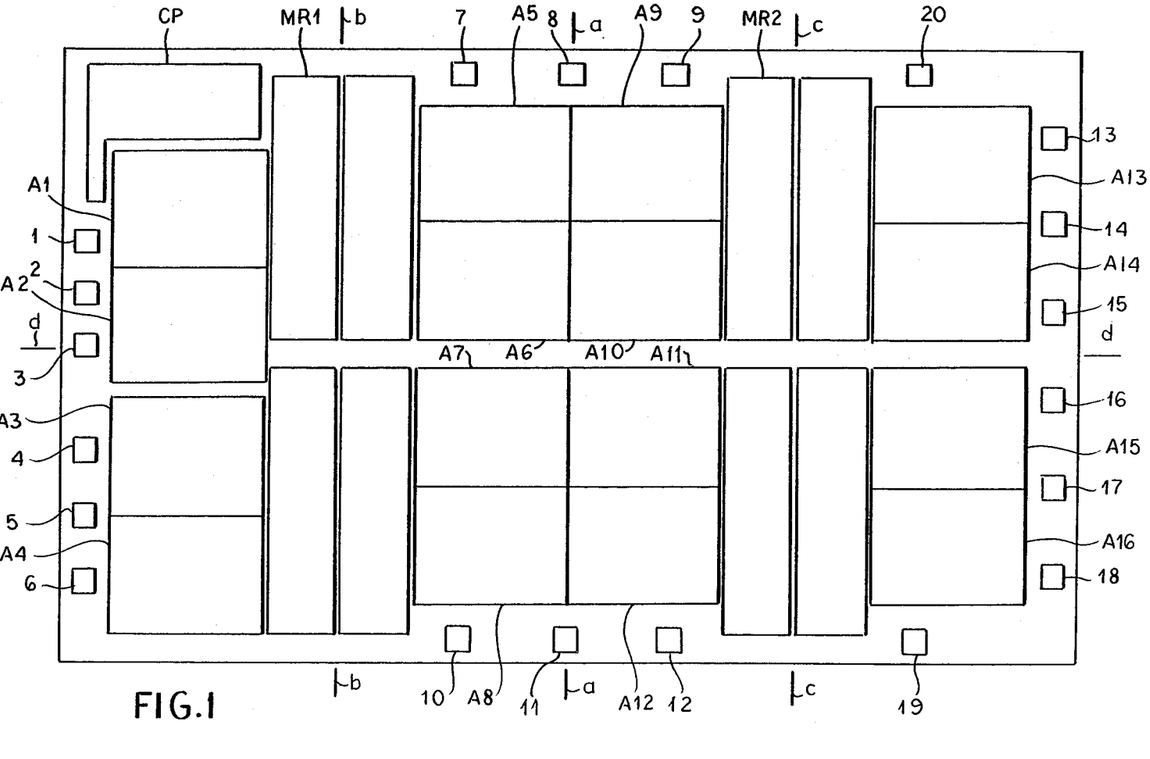
FIG. 1 is a plan view of the integrated circuit according to one embodiment, displaying the main modules.

The main parts of the integrated circuit are shown in FIG. 1. They consist of 16 amplifying modules, denoted by A1, A2, . . . A16, programmable both as integrators and as actual broad-band operational amplifiers, of a bias circuit, denoted by CP, suited to feed with bias currents all the amplifying modules and of two resistive matrices, denoted by MR1 and MR2, consisting of a plurality of equal resistive elements, by which resistive dividers for interconnecting the various amplifying modules can be made.

FIG. 1 emphasizes the symmetry of the arrangement of amplifying modules and resistive matrices with respect to a vertical median line a-a. This characteristic facilitates programming flexibility of the desired system function. I fact, the suitable choice of the arrangement, as well as of the number of amplifying modules, places each matrix adjacent to eight out of the 16 modules present. As a consequence, connecting lines to be made according to the programmation demanded by the customer do not present particular topological problems.

Figure 8:
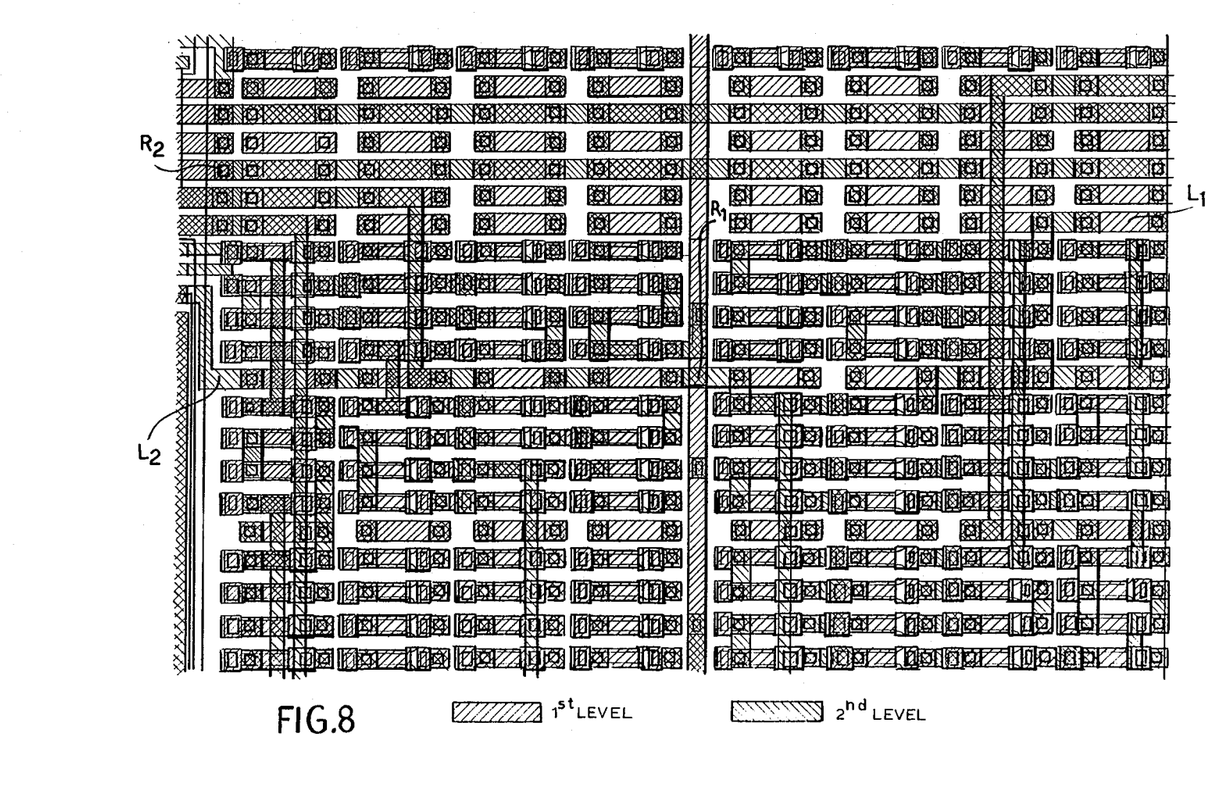
FIG. 8 is a diagrammatic plan view showing the layout of the metal layers, the first and second layers being represented by different diagonal hatching.
Figure 9:
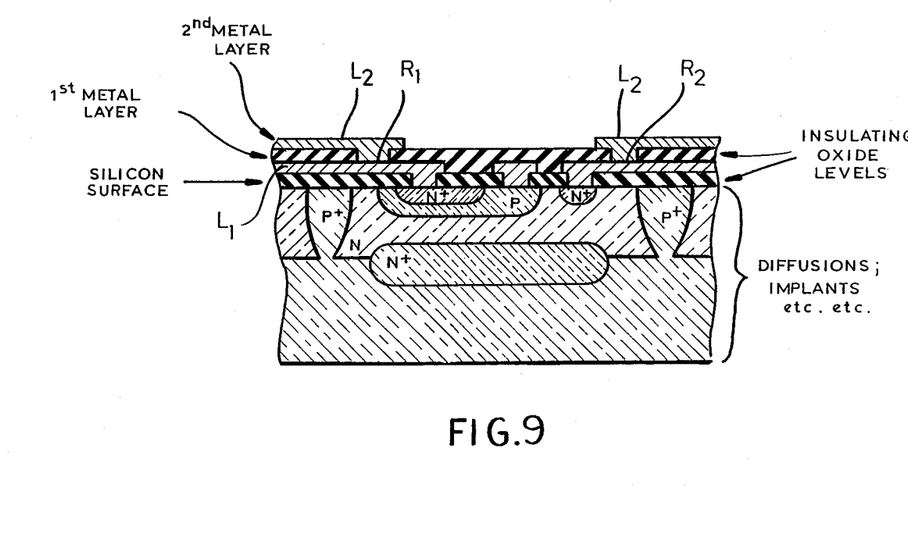
FIG. 9 is a diagrammatic section showing metal bridges between levels.

Either part of the circuit can also be taken as spatially symmetrical with respect to a median vertical line b-b or symmetrical to the vertical line c-c, coincident with a ground electrical line. At each side there can be found first the resistive matrix elements and then four amplifying modules per side. This arrangement proves particularly advantageous since many of the resistive dividers necessary in a circuit of an active "R type filter" have a grounded terminal. The ground line is implemented at the first metal level $L_1$ and disposes of different points $R'$, $R_2$ contact with the second programmable metal level $L_2'$ see FIGS. 8 and 9.

Moreover, both parts of the circuit can be taken as generally symmetrical with respect to a horizontal median line d-d, coincident with a plurality of horizontal metal trunks of the first fixed level. These trunks are used to interconnect a number of pads 1,2 . . . ,20 with the amplifying modules and to interconnect the two circuit parts symmetrical with respect to vertical line a—a.

Figure 2:
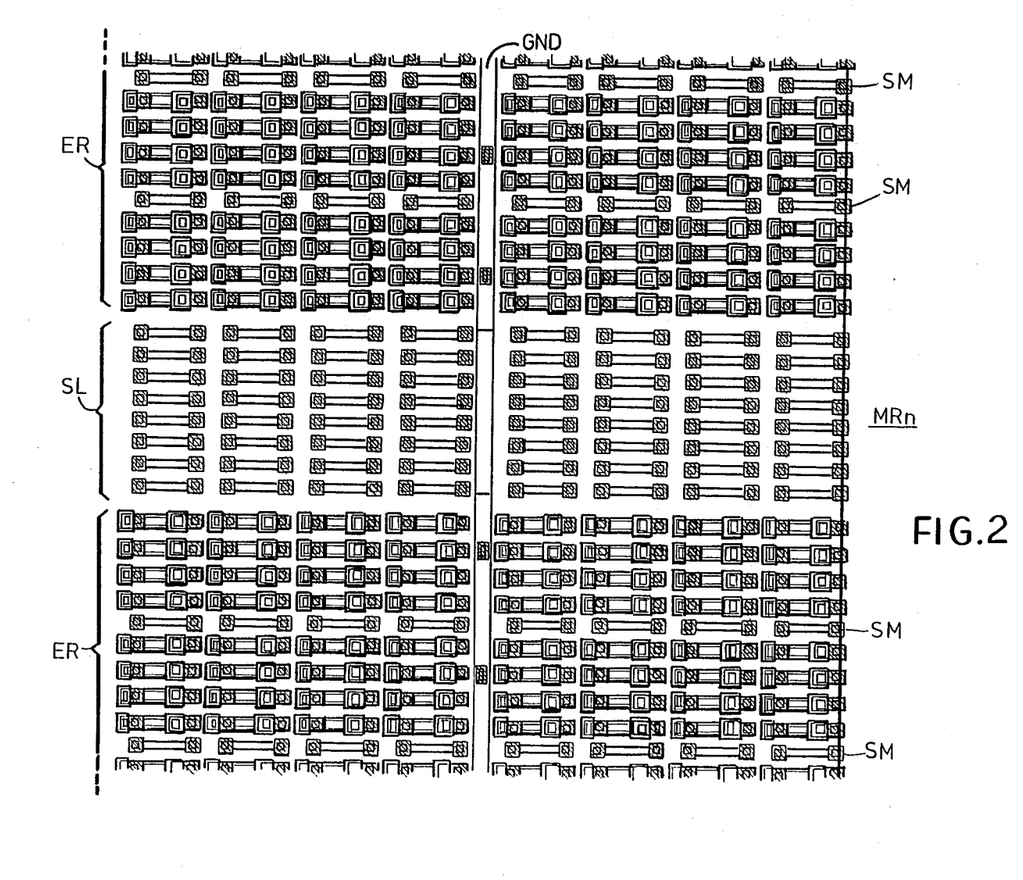
FIG. 2 is a representation of the central region of a resistive matrix, denoted by MR1 or MR2 in FIG. 1.

FIG. 2 shows a detail of the central zone of a resistive matrix. It consists of 8 columns by 88 rows of modular resistive elements ER horizontally arranged and separated every fourth row by a row SM of 8 metal trunks. The latter trunks are basically usable for connecting the terminals of the various resistors to amplifying modules, to other resistors or to ground. Of course, the desired resistive values are obtained by arranging in series or in parallel a plurality of resistive elements ER.

Each resistive matrix is traversed in the horizontal median zone by 64 metal trunks SL, horizontally arranged according to a matrix of 8 rows by 8 columns.

The resistive elements and metal trunks are sized so as to allow the passage of two vertical metal lines of the programmable second level $L_2$. They are suitably spaced from each other and each is spaced from the terminals of resistive elements and trunks, according to the standards of the technological method adopted. Based on the desired programmation of the second metal level, suitable connections with the terminals of resistive elements and trunks can thus be established.

Figure 3:
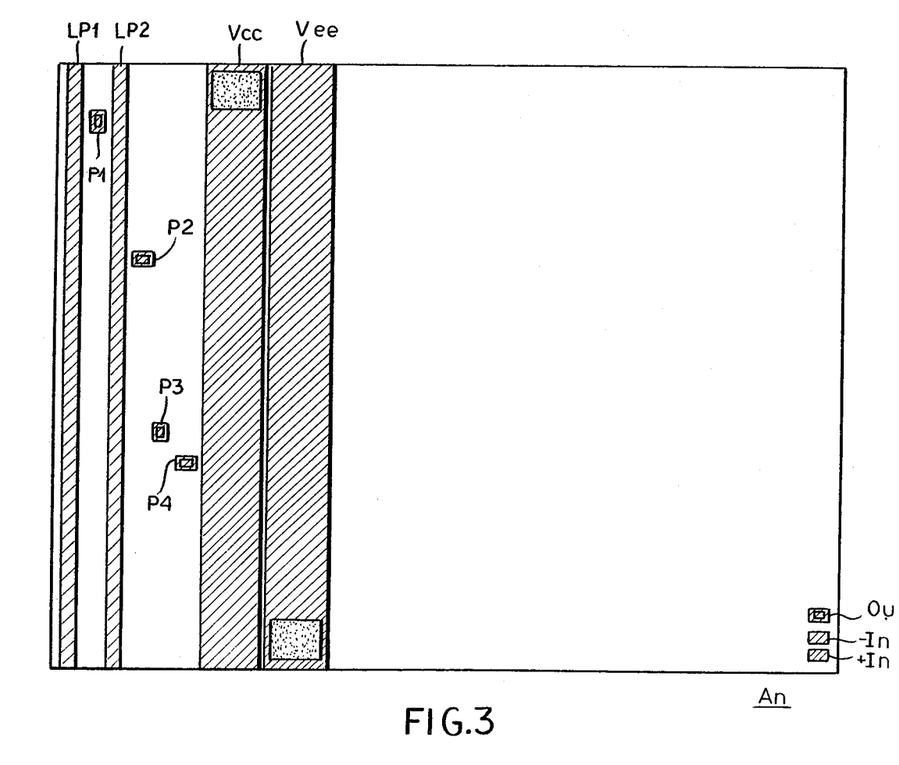
FIG. 3 shows the connection for bias and power supply of one of or a plurality of modules denoted by An (n=1, . . . ,16) in FIG. 1.

One of the amplifying modules An (n=1, . . . ,16) is shown in FIG. 3. Said modules can be programmed according to the customer's design through a second metal level so as to make them act, within the filter to be implemented, as actual integrators or as input or output buffers.

As an alternative, they can be left unutilized.

As shown in the Figure, each amplifying module is traversed by electrical lines LP1, LP2 supplying bias currents and is always connected to power-supply lines Vcc and Vee.

Moreover, the module is equipped with points of access to the second metal level, P1 and P2, which follow its connection to bias lines LP1 and LP2, according to the filter design required by the customer. Each module, provided that it is not connected to bias lines, remains inactive and even if fed, does not dissipate energy.

P3 and P4 denote points of access to the second metal level. By short-circuiting P3 and P4 the configuration of the input stage can be changed and hence the integrator can be converted into a buffer.

Ou, +In and −In denote respectively access points connected to the output and to the non-inverting and inverting inputs of the amplifying module. Output and inverting input are brought closer so as to make their connection easier in case a buffer configuration is desired.

Figure 4:
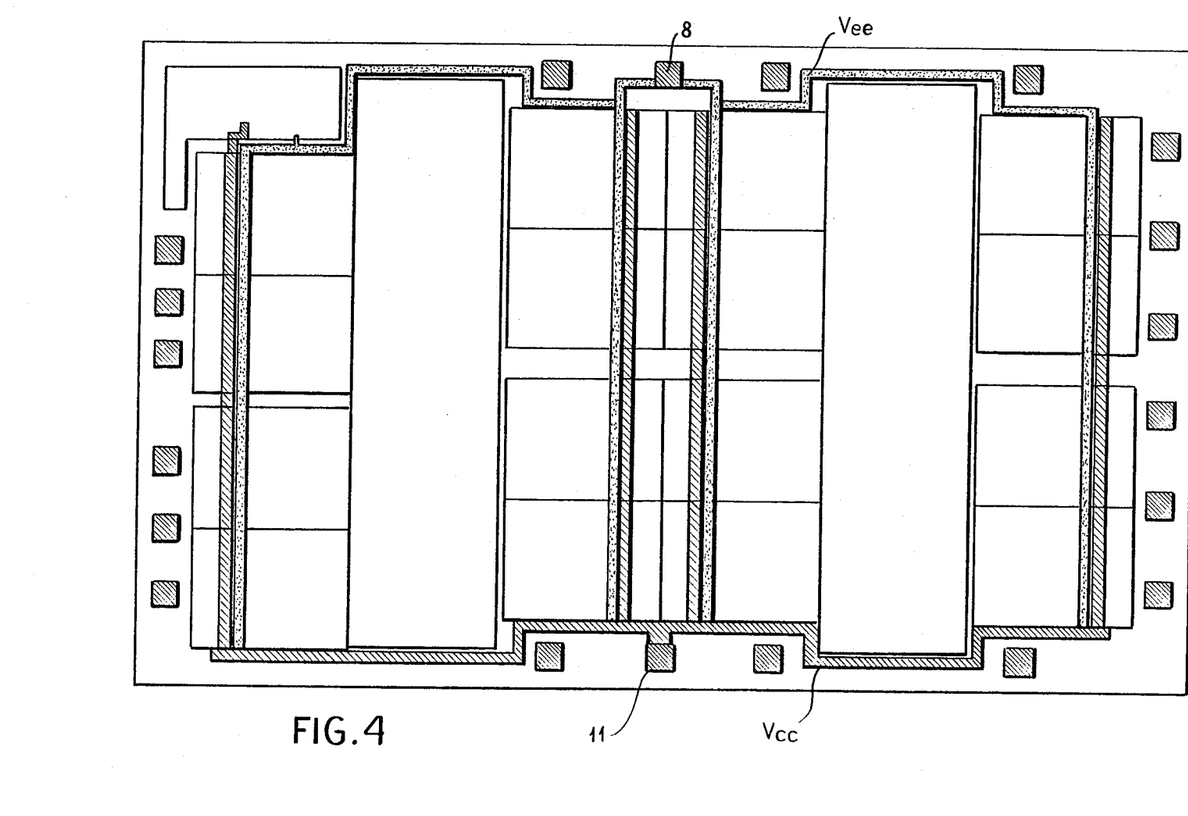
FIG. 4 is a diagrammatic plan view of power-supply connections.

FIG. 4 shows lines Vee and Vcc distributing power-supply currents to the amplifying modules and the bias circuit.

They can be accessed from the outside through pads 8 and 11, placed in the upper and lower median parts. Each line consists in of a wide metal routing which horizontally follows the upper and lower boundary of the modules and matrices and in vertical lines for the connection with all the active blocks, according to a comb structure.

Figure 5:
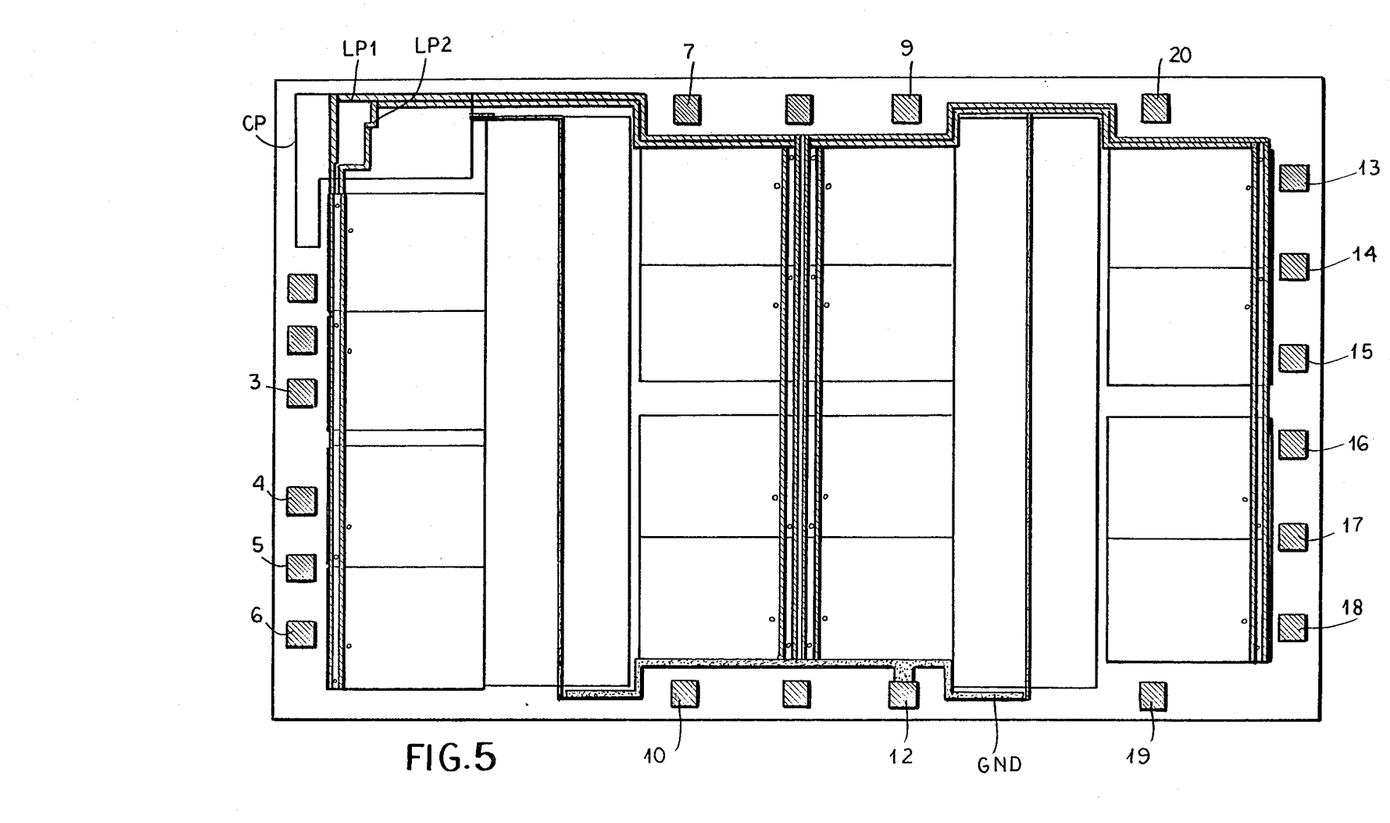
FIG. 5 is a diagrammatic plan view of bias and ground connections for modules indicated by An in FIG. 1.

FIG. 5 shows the ground line GND, connected to pad 12, and lines LP1 and LP2 distributing bias currents. The ground line consists of a wide horizontal metal routing and of vertical branches traversing the resistive matrices. One of them arrives at bias circuit CP.

CP is positioned so as to meet three main requirements:

(1) accessibility to two pads for the connection to the outside, in order to program bias currents with external resistors;

(2) accessibility to the ground line, unlike the amplifying modules which require only positive and negative voltages;

(3) possibility of being interconnected with all the amplifying modules as simply as possible.

These requirements are met by positioning bias circuit CP in the upper left corner, near pads 1 and 2 and having the ground line traversing the left resistive matrix by a short line trunk.

Two vertical lines start from the bias circuit directly accessing the first column of the amplifying modules on the left and two horizontal lines follow the upper side. Wherefrom, in suitable position, three pairs of vertical lines are derived for the other three columns of amplifying modules. As already mentioned, the connection between vertical bias lines and amplifying modules are established by means of small jumpers implemented at the second metal level, according to the design demanded by the customer.

Comb lines for power-supply, ground and bias are, however, non-programmable fixed parts of the circuit, that is why they are implemented by using both metal levels.

All the pads left unused for power-supply, ground or bias circuit programming, i.e. 3-7, 9, 10, 13-20, are available as input and output terminals for carrying out the required system functions.

To this end, a number of lines are present which form the pads of the right and left sides, passing into the horizontal median zone, to access the closest resistive matrix. The lines present on the upper and lower side directly access the vertices of the closest resistive matrix by short and suitable jumps of two metal levels for power-supply, bias and ground.

Figure 6:
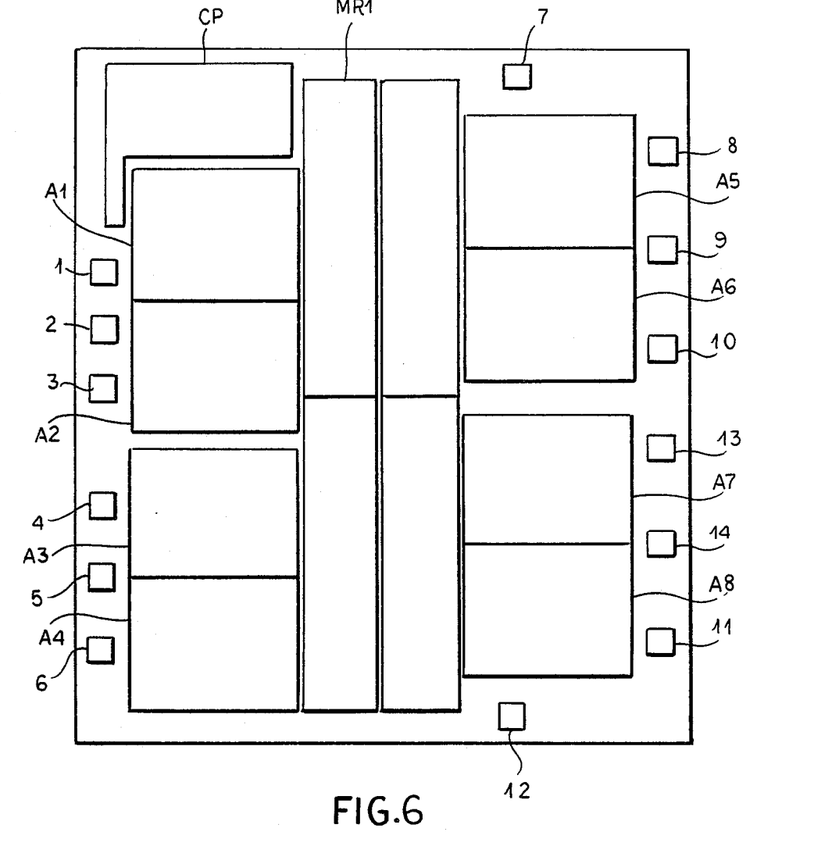
FIG. 6 is a view similar to FIG. 1 of the integrated circuit comprising eight amplifying modules.

FIG. 6 shows an integrated circuit comprising only eight amplifying modules A1, . . . ,A8, a single resistive matrix MR1 and a bias circuit CP.

The pads connected to ground, positive and negative power-supply and programming of bias circuit have been indicated with the same reference numbers as in the preceding FIGS.

Figure 7:
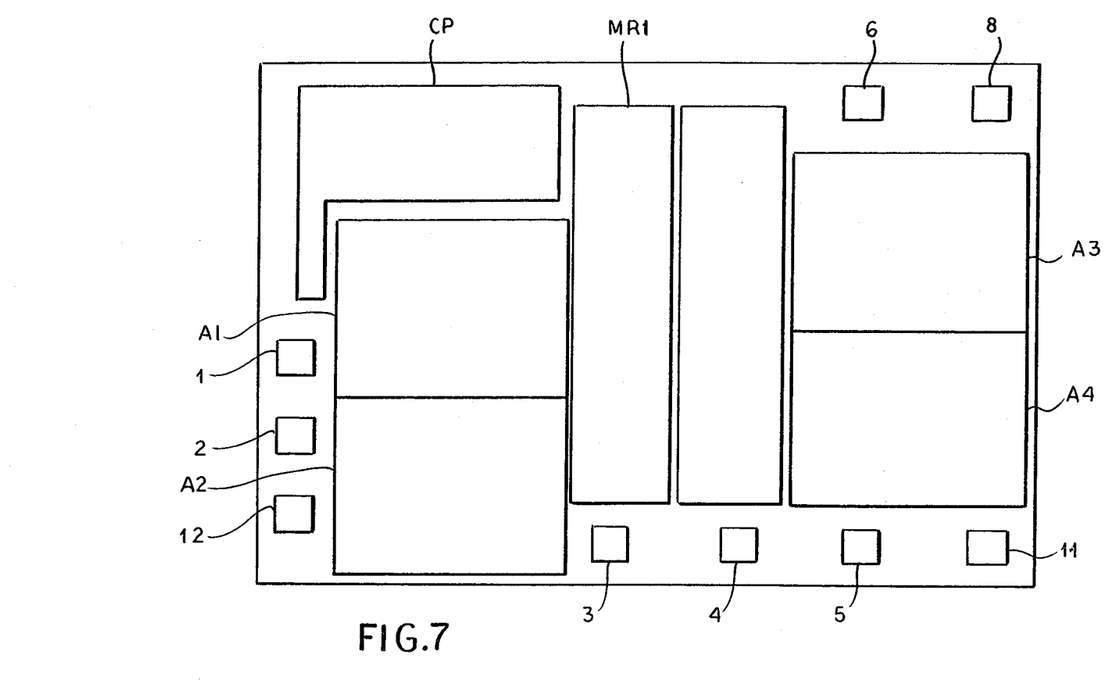
FIG. 7 is a view similar to FIG. 1 of an integrated circuit comprising 4 amplifying modules.

FIG. 7 shows a further integrated circuit comprising just four amplifying modules A1, . . . A4, a resistive matrix MR1 of halved size and bias circuit CP. Also in this case the reference numbers of the pads with functions analogous to those of the preceding integrated circuits have been maintained.

We claim:

1. An integrated circuit selectively programmable to form an active filter without external circuit components, said integrated circuit comprising $2^m$ amplifying modules where m is an integer between 2 and 4, inclusive, p resistive matrices where p is 1 when m is other than 4 and is 2 when m=4, and a bias circuit, r of said amplifying modules being positioned in a first column separated a second column of r amplifying modules by a respective one of said resistive matrices, where r=4 when m is other than 2 and r=2 when m=2, said second column of amplifying modules being separated from a third column of 4 amplifying modules when m=4 by a second of said resistive matrices, a resistive matrix being selectively connectable to all of the modules of the columns between which the resistive matrix is located and having identical resistors selectively connectable in series and in parallel to program said modules selectively and form integrators selectively therefrom, said integrated circuit having sixteen of said amplifying modules, two resistive matrices and said bias circuit, four of said amplifying modules being disposed in each of said first and third columns, and eight of said amplifying modules being disposed in said second column in two adjacent rows of four amplifying modules each.

2. An integrated circuit selectively programmable to form an active filter without external circuit components, said integrated circuit comprising $2^m$ amplifying modules where m is an integer between 2 and 4, inclusive, p resistive matrices where p is 1 when m is other than 4 and is 2 when m=4, and a bias circuit, r of said amplifying modules being positioned in a first column separated from a second column or r amplifying modules by a respective one of said resistive matrices, where r=4 when m is other than 2 and r=2 when m=2, said second column of amplifying modules being separated from a third column of 4 amplifying modules when m=4 by a second of said resistive matrices, a resistive matrix being selectively connectable to all of the modules of the columns between which the resistive matrix is located and having identical resistors selectively connectable in series and in parallel to program said modules selectively and form integrators selectively therefrom, each of said resistive matrices comprising eight columns by eighty-eight rows of modular resistive elements arranged horizontally and separated every four rows by a row of eight metal trunks, said resistive matrices each being traversed in a horizontal median zone by sixty four metal trunks horizontally arranged in a matrix of eight rows by eight columns in a first metal layer of said integrated circuit, the resistive elements and said trunks being equipped with respective accesses to a second metal level of the integrated circuit.

3. The integrated circuit defied in claim 2 wherein each of the amplifying modules is equipped with respective accesses to said second metal level for connection with bias lines, for programming circuit configuration on said second metal level, and for an output and for inverting and noninverting inputs.

4. The integrated circuit defined in claim 3, further comprising pads to which power-supply and ground lines are connected, each of said power-supply and ground lines consisting of a wide line horizontally following an upper or lower profile of said amplifying modules and matrices and of vertical lines and being connected to said amplifying modules and said bias circuit, ground vertical lines being provided between said resistive matrices and accessing said bias circuit.

5. The integrated circuit defined in claim 3 wherein said bias lines start from said bias circuit, follow an upper boundary of said amplifying modules at least partly horizontally and a boundary of said resistive matrices accesses to the second metal level being provided for connection of said bias lines with said amplifying modules.

6. The integrated circuit defined in claim 3 wherein pads are provided for programming bias currents through external resistors, and further pads are provided for active-filter inputs and outputs.

7. An integrated circuit selectively programmable to form an active filter without external circuit components, said integrated circuit comprising a rectangular semiconductor body formed integrally in bipolar technology with sixteen amplifying modules, two resistive matrices oi identical resistances, and a bias circuit, four of said amplifying modules being positioned in a first column separated from a second column of eight amplifying modules in two adjacent rows each of four amplifying modules by a respective one of said resistive matrices, said second column of amplifying modules being separated form a third column of four amplifying modules by a second of said resistive matrices whereby each of said resistive matrices is positioned to interconnect up to eight of said amplifying modules, said amplifying modules of the columns separated by each of said resistive matrices and the respective resistive matrix being provided with points of access to at least one metal level at a level of the integrated circuit other than that on which said amplifying modules and resistive matrices are provided to permit metal jumpers on said metal level to interconnect resistors of each matrix together in series and in parallel and to the amplifying modules of the columns separated by each matrix and to interconnect said amplifying modules to said bias circuit to program the intergrated circuit selectively to form an integrator configuration for selective ones of said amplifying modules in constituting an active filter solely by selective application of the jumpers, said body being further formed with:

a pair of bias conductors connected to said bias circuit and extending along each of said columns for connection to selected ones of said amplifier modules by jumpers at said metal level through respective ones of said points of access, two power conductor strips extending parallel to one another along each of said columns and permanently connected to all of said modules, and respective power distributing strips interconnecting said conductor strips along edges of said body, and a ground conductor extending centrally through each of said resistive matrices for selected connection to the resistors thereof by others of said points of access by respective ones of said jumpers, and connected permanently to said bias circuit.

8. An integrated circuit selectively programmable to form an active filter without external circuit components, said integrated circuit comprising a rectangular semiconductor body formed integrally in bipolar technology with eight amplifying modules, a resistive matrix of identical resistances, and a bias circuit, four of said amplifying modules being positioned in a first column separated from a second column of four amplifying modules by said resistive matrix, whereby each of said resistive matrices is positioned to interconnect up to eight of said amplifying modules, said amplifying modules of the columns separated by said resistive matrix and the respective resistive matrix being provided with points of access to at leas& one metal level at a level of the integrated circuit other than that on which said amplifying modules and resistive matrix are provided to permit metal jumpers on said metal level to interconnect resistors of said matrix together in series and in parallel and to the amplifying modules of the columns separated by said matrix and to interconnect said amplifying modules to said bias circuit to program the intergrated circuit selectively to form an integrator configuration for selective ones of said amplifying modules in constituting an active filter solely by selective application of the jumpers, said body being further formed with:

a pair of bias conductors connected to said bias circuit and extending along each of said columns for connection to selected ones of said amplifier modules by jumpers at said metal level through respective ones of said points of access, two power conductor strips extending parallel to one another along each of said columns and permanently connected to all of said modules, and respective power distributing strips interconnecting said conductor strips along edges of said body, and a ground conductor extending centrally through said resistive matrix for selected connection to the resistors thereof by others of said points of access by respective ones of said jumpers, and connected permanently to said bias circuit.

9. An integrated circuit selectively programmable to form an active filter without external circuit components, said integrated circuit comprising a rectangular semiconductor body formed integrally in bipolar technology with four amplifying modules, a resistive matrix of identical resistances, and a bias circuit, two of said amplifying modules being positioned in a first column separated from a second column of two amplifying modules by said resistive matrix, whereby each of said resistive matrices is positioned to interconnect up to four of said amplifying modules, said amplifying modules of the columns separated by said resistive matrix and the respective resistive matrix being provided with points of access to at least one metal level at a level of the integrated circuit other than that on which said amplifying modules and resistive matrix are provided to permit metal jumpers on said metal level to interconnect resistors of said matrix together in series and in parallel and to the amplifying modules of the columns separated by said matrix and to interconnect said amplifying modules to said bias circuit to program the integrated circuit selectively to form an integrator configuration for selective ones of said amplifying modules in constituting an active filter solely by selective application of the jumpers, said body being further formed with:

a pair of bias conductors connected to said bias circuit and extending along each of said columns for connection to selected ones of said amplifier modules by jumpers at said metal level through respective ones of said points of access, two power conductor strips extending parallel to one another along each of said columns and permanently connected to all of said modules, and respective power distributing strips interconnecting said conductor strips along an edge of said body, and a ground conductor extending centrally through said resistive matrix for selected connection to the resistors thereof by others of said points of access by respective ones of said jumpers, and connected permanently to said bias circuit.

* * * * *